US011280931B2

(12) United States Patent
Cheng et al.

(10) Patent No.: US 11,280,931 B2
(45) Date of Patent: Mar. 22, 2022

(54) RESERVOIR FORMATION CHARACTERIZATION FROM NMR T1/T2 RATIO

(71) Applicant: Halliburton Energy Services, Inc., Houston, TX (US)

(72) Inventors: Yusheng Cheng, Spring, TX (US); Songhua Chen, Katy, TX (US); Magdalena Sandor, Humble, TX (US); Wei Shao, Conroe, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 685 days.

(21) Appl. No.: 16/079,977

(22) PCT Filed: May 9, 2017

(86) PCT No.: PCT/US2017/031833
§ 371 (c)(1),
(2) Date: Aug. 24, 2018

(87) PCT Pub. No.: WO2018/208296
PCT Pub. Date: Nov. 15, 2018

(65) Prior Publication Data
US 2021/0190989 A1 Jun. 24, 2021

(51) Int. Cl.
*G01V 3/32* (2006.01)
*E21B 49/00* (2006.01)
(Continued)

(52) U.S. Cl.
CPC ............... *G01V 3/32* (2013.01); *E21B 49/00* (2013.01); *G01R 33/448* (2013.01); *G01V 3/38* (2013.01)

(58) Field of Classification Search
CPC .......... G01V 3/32; G01V 3/38; G01R 33/448; E21B 49/00
See application file for complete search history.

(56) References Cited

U.S. PATENT DOCUMENTS

| 7,221,158 B1 | 5/2007 | Ramakrishnan |
| 10,353,032 B2 * | 7/2019 | Sandor ............... G01R 33/5615 |
| (Continued) | | |

FOREIGN PATENT DOCUMENTS

WO WO-2016081361 A1 5/2016

OTHER PUBLICATIONS

International Search Report for PCT Application No. PCT/US2017/0318338, dated Dec. 15, 2017.

*Primary Examiner* — Susan S Lee
(74) *Attorney, Agent, or Firm* — John Wustenberg; Parker Justiss, P.C.

(57) ABSTRACT

A method for estimating a property of an earth formation is provided. At least one porosity dataset is received. The porosity dataset is analysed to determine pore-throat size distribution. A NMR measurements dataset is received from a NMR tool. The dataset is analyzed to determine a distribution of a first relaxation time versus a second relaxation time. Distribution of a ratio of the first relaxation time to the second relaxation time is determined by calculating a ratio between a geometric mean of the first relaxation and the second relaxation time. A threshold for the ratio of the first relaxation time to the second relaxation time is selected. The threshold indicates a value of the ratio corresponding to pore sizes not contributing to property of the formation. The property of the formation is determined using the determined threshold for the ratio of the first relaxation time to the second relaxation time.

19 Claims, 14 Drawing Sheets

(51) Int. Cl.
    *G01R 33/44*     (2006.01)
    *G01V 3/38*     (2006.01)

(56) References Cited

U.S. PATENT DOCUMENTS

| | | |
|---|---|---|
| 2005/0104587 A1 | 5/2005 | Akkurt |
| 2008/0120034 A1* | 5/2008 | Georgi ................ G01N 24/081 |
| | | 702/6 |
| 2008/0221800 A1* | 9/2008 | Gladkikh ................ G01V 5/04 |
| | | 702/11 |
| 2009/0093962 A1* | 4/2009 | Akkurt ................... G01R 33/50 |
| | | 702/11 |
| 2010/0313633 A1 | 12/2010 | Anand et al. |
| 2013/0261973 A1 | 10/2013 | Li |
| 2014/0055134 A1 | 2/2014 | Fordham et al. |
| 2016/0139291 A1 | 5/2016 | Saidian et al. |
| 2016/0370492 A1 | 12/2016 | Chen et al. |

\* cited by examiner

606 - ρ1 = 1μm/s
608 - ρ1 = 3μm/s
610 - ρ1 = 6μm/s
612 - lower pore size boundary
614 - upper pore size boundary
616 - T1/T2 threshold 706 - ρ1 = 1μm/s
708 - ρ1 = 3μm/s
710 - ρ1 = 6μm/s
712 - lower pore size boundary
714 - upper pore size boundary
716 - T1/T2 threshold 806 - ρ1 = 1μm/s
808 - ρ1 = 3μm/s
810 - ρ1 = 6μm/s
812 - lower pore size boundary
814 - upper pore size boundary
816 - T1/T2 threshold 906 - ρ1 = 1μm/s
908 - ρ1 = 3μm/s
910 - ρ1 = 6μm/s
912 - lower pore size boundary
914 - upper pore size boundary
916 - T1/T2 threshold

RESERVOIR FORMATION CHARACTERIZATION FROM NMR T1/T2 RATIO

CROSS REFERENCE TO RELATED APPLICATIONS

This application is the U.S. National Stage of PCT International Application No. PCT/US2017/031833, filed May 9, 2017, the entire disclosure of which is hereby incorporated herein by reference in its entirety.

TECHNICAL FIELD OF THE INVENTION

The embodiments disclosed herein generally relate to nuclear magnetic resonance (NMR) well logging and, more particularly, to methods of reservoir formation characterization from NMR $T_1/T_2$ ratio, among other measurements.

BACKGROUND OF THE INVENTION

Boreholes are drilled deep into the earth for many applications such as hydrocarbon exploration, geothermal production, and carbon dioxide sequestration. Different types of measurements are usually performed on a geologic formation tools in order to efficiently use production resources. One type of important measurement is permeability. Permeability relates to a measurement of the ability of a rock to transmit fluids generally through connected pores. Permeability is determined from the pore sizes that can transmit fluid and is usually measured using a nuclear magnetic resonance (NMR) tool disposed in a borehole penetrating the geologic formation.

Two standard permeability equations have been established for applications in the oil industry. The Schlumberger-Doll Research (SDR) equation uses simply the geometric mean of the measure $T_2$ distribution to derive permeability. The Timur-Coates equation uses a $T_2$ cutoff value that divides the $T_2$ distribution into a movable and an irreducible fluid saturation and relates these values to permeability. Both equations show permeability as function of porosity and parameter or parameters that are derived from the $T_2$ distribution, i.e., determination of pore size distribution. Although the two equations are apparently different, both equations describe the same underlying information by different means. The two equations are successfully used to characterize siliciclastic rock containing mixed pore-size distributions. However, their application for carbonate rock characterization is more problematic. In carbonates, NMR parameters used to estimate permeability and irreducible water saturation vary in sometimes unpredictable ways. Hence, it would be appreciated in the drilling industry if techniques to determine formation permeability could be improved.

BRIEF DESCRIPTION OF THE SEVERAL VIEWS OF THE DRAWING

For a more complete understanding of the disclosed embodiments, and for further advantages thereof, reference is now made to the following description taken in conjunction with the accompanying drawings in which.

DETAILED DESCRIPTION OF THE DISCLOSED EMBODIMENTS

Figure 1:
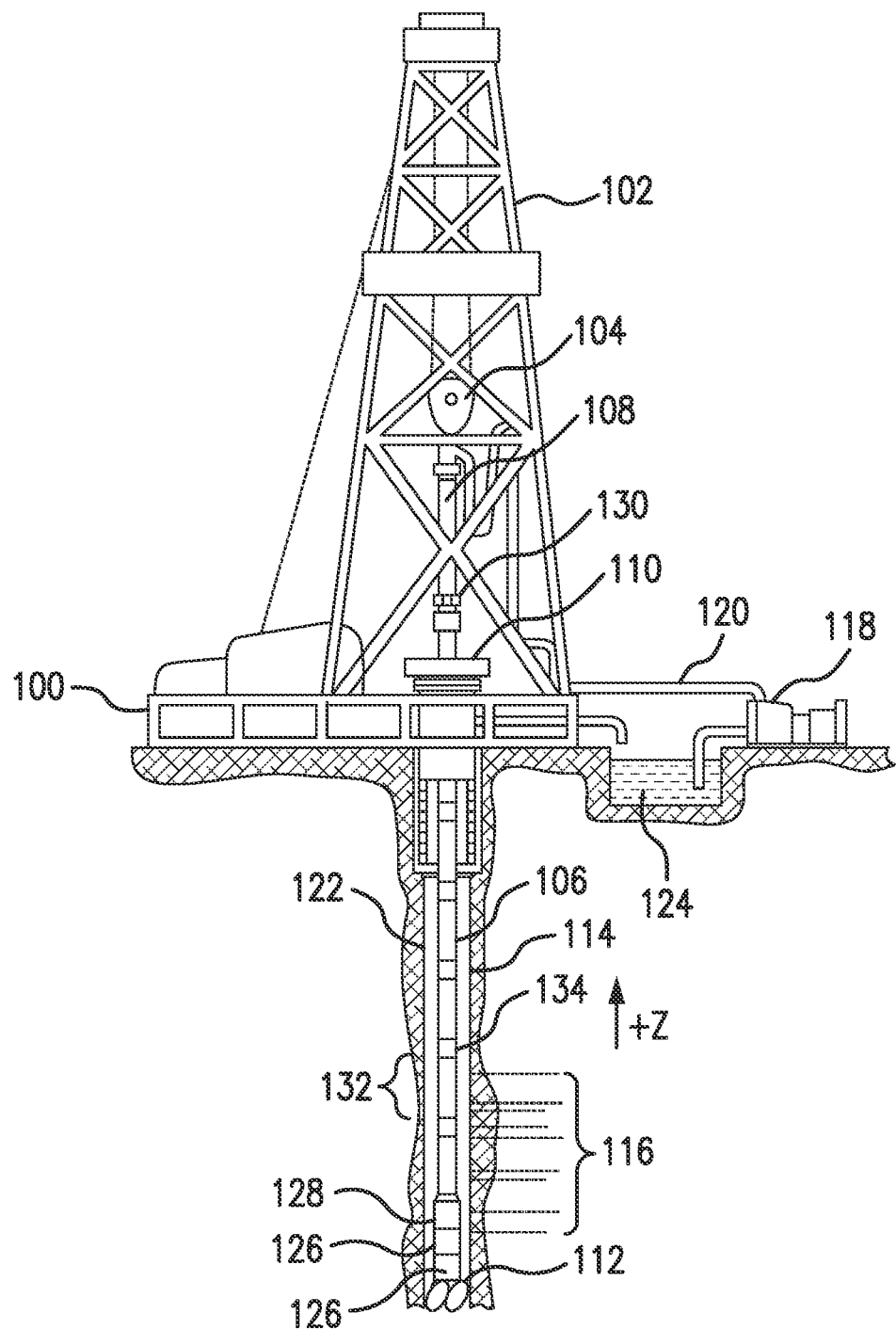
FIG. 1 shows an illustrative logging while drilling (LWD) environment, in accordance with embodiments of the present invention.

The following discussion is presented to enable a person skilled in the art to make and use the invention. Various modifications will be readily apparent to those skilled in the art, and the general principles described herein may be applied to embodiments and applications other than those detailed below without departing from the spirit and scope of the disclosed embodiments as defined herein. The disclosed embodiments are not intended to be limited to the particular embodiments shown, but are to be accorded the widest scope consistent with the principles and features disclosed herein.

The terms "couple" or "coupled" as used herein are intended to mean either an indirect or a direct connection. Thus, if a first device couples to a second device, that connection may be through a direct connection, or through an indirect electrical or mechanical connection via other devices and connections. The term "upstream" as used herein means along a flow path towards the source of the flow, and the term "downstream" as used herein means along a flow path away from the source of the flow. The term "uphole" as used herein means along the drill string or the hole from the distal end towards the surface, and "downhole" as used herein means along the drill string or the hole from the surface towards the distal end.

It will be understood that the term "oil well drilling equipment" or "oil well drilling system" is not intended to limit the use of the equipment and processes described with those terms to drilling an oil well. The terms also encompass drilling natural gas wells or hydrocarbon wells in general. Further, such wells can be used for production, monitoring, or injection in relation to the recovery of hydrocarbons or other materials from the subsurface. This could also include geothermal wells intended to provide a source of heat energy instead of hydrocarbons.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

For purposes of this disclosure, an information processing system may include any device or assembly of devices operable to compute, classify, process, transmit, receive, retrieve, originate, switch, store, display, manifest, detect, record, reproduce, handle, or utilize any form of information, intelligence, or data for business, scientific, control, or other purposes. Examples of well-known computing systems, environments, and/or configurations that may be suitable for use with the information processing system include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed data processing environments that include any of the above systems or devices or any other suitable device that may vary in size, shape, performance, functionality, and price. The information processing system may include a variety of computer system readable media. Such media may be any available media that is accessible by the information processing system, and it includes both volatile and non-volatile media, removable and non-removable media. The information processing system can include computer system readable media in the form of volatile memory, such as random access memory (RAM) and/or cache memory. The information processing system may further include other removable/non-removable, volatile/non-volatile computer system storage media, one or more processing resources such as a central processing unit ("CPU") or hardware or software control logic, and/or ROM. Additional components of the information processing system may include one or more network ports for communication with external devices as well as various input and output ("I/O") devices, such as a keyboard, a mouse, and a video display. The information processing system may also include one or more buses operable to transmit communications between the various hardware components.

Disclosed are apparatus and method for estimating permeability of an earth formation with improved accuracy using NMR data obtained from an NMR tool. Improved accuracy derives from using a pore model customized for each formation logged by the NMR tool. Statistically distinguishable peaks in size distribution of pores are considered as separate types of pores in the rock formation. Depending on the shape and relative weight of the peaks, the pore types that contribute to the majority of the fluid flow are selected and the average size of these pore types are computed. The permeability is then calculated using only the pore types that contribute to the majority of the fluid flow.

The operation of the disclosed NMR logging system and method embodiments is best understood in context. Accordingly, FIG. 1 shows an illustrative logging while drilling (LWD) environment. A drilling platform 100 supports a derrick 102 having a traveling block 104 for raising and lowering a drill string 106. A drill string kelly 108 supports the rest of the drill string 106 as it is lowered through a rotary table 110. The rotary table 110 rotates the drill string 106, thereby turning a drill bit 112. As bit 112 rotates, it creates a borehole 114 that passes through various formations 116. A pump 118 circulates drilling fluid through a feed pipe 120 to kelly 108, downhole through the interior of drill string 106, through orifices in drill bit 112, back to the surface via the annulus 122 around drill string 106, and into a retention pit 124. The drilling fluid transports cuttings from the borehole 114 into the pit 124 and aids in maintaining the integrity of the borehole. Depending on the job requirements, the drilling fluid may be oil-based (with a high resistivity) or water-based (with a low resistivity).

The drill bit 112 is just one piece of an open-hole LWD assembly that includes one or more drill collars 126 and logging tools 128, 132. Drill collars 126 are thick-walled steel pipe sections that provide weight and rigidity for the drilling process. The logging tools 128, 132 (some of which may be built in to the drill collars) gather measurements of various drilling or formation parameters. As an example, logging instrument 128 may be integrated into the bottom-hole assembly near the bit 112 to collect pulsed neutron tool density measurements, acoustic wave propagation measurements, or gamma ray intensity measurements. Meanwhile, logging tool 132 may be coupled to other modules of drill string 106 by one or more adaptors 134. In accordance with some embodiments, either of logging tools 128, 132 may include an NMR logging tool configured to perform and/or be directed by the reservoir characterization techniques described herein.

Measurements from the logging tools 128, 132 can be acquired by a telemetry sub (e.g., built in to logging tool 128) to be stored in internal memory and/or communicated to the surface via a communications link. Mud pulse telemetry is one common technique for providing a communications link for transferring logging measurements to a surface receiver 130 and for receiving commands from the surface, but other telemetry techniques can also be used.

Figure 2:
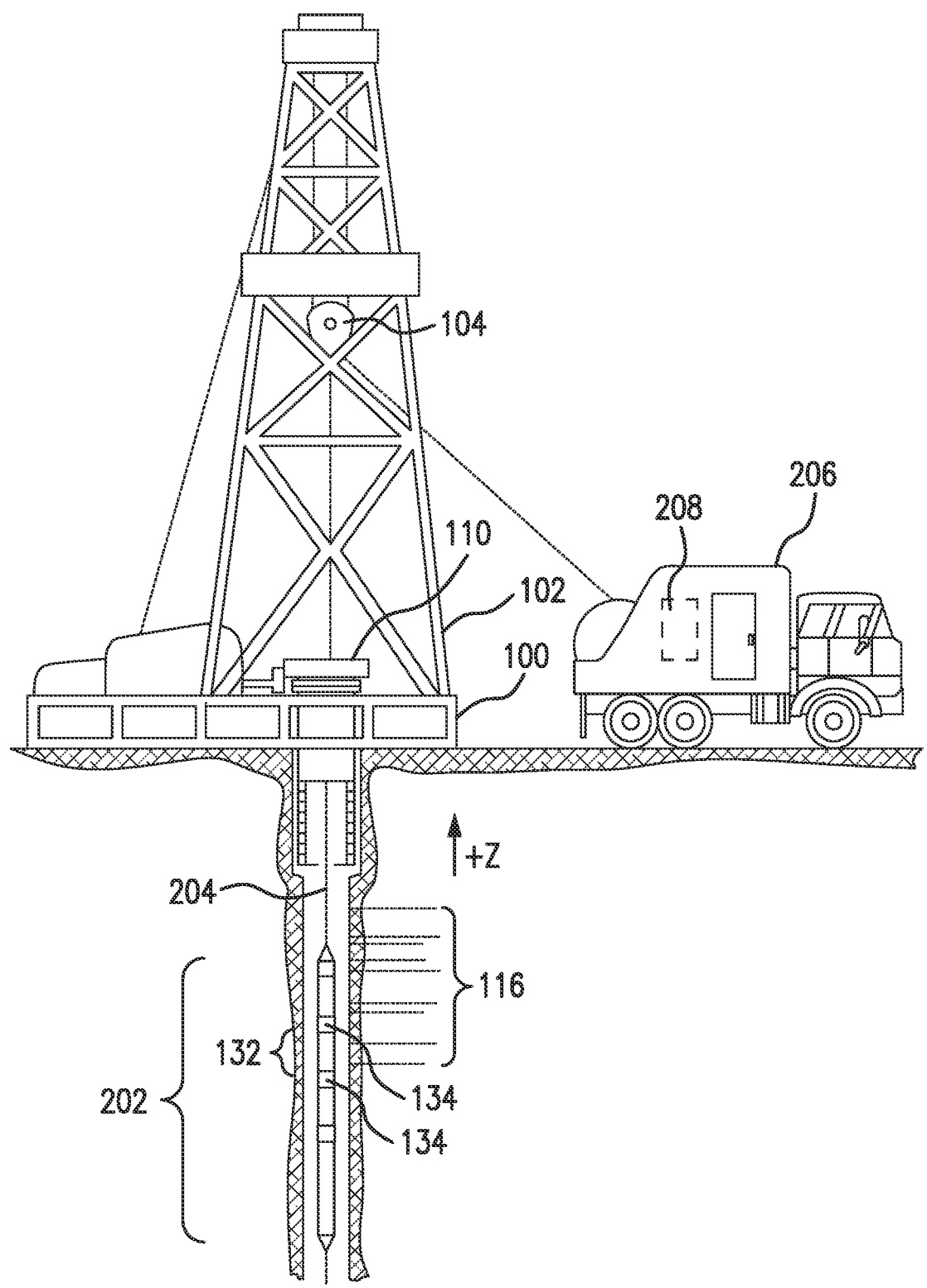
FIG. 2 shows an illustrative wireline logging environment, in accordance with embodiments of the present disclosure.

At various times during the drilling process, the drill string 106 shown in FIG. 1 may be removed from the borehole 114. Once the drill string 106 has been removed, as shown in FIG. 2, logging operations can be conducted using a wireline logging tool or tool string 202 (i.e., an assembly of logging tools suspended by a conveyance 204 having conductors for transporting power to the tools and telemetry from the tools to the surface). It should be noted that various types of formation property sensors can be included with the wireline logging tool 202. For example, the illustrative wireline logging tool 202 includes logging tool 132, which may correspond to an NMR logging tool configured to perform and/or be directed by the characterization techniques described herein. The logging tool 132 may be coupled to other modules of wireline logging tool 202 by one or more adaptors or cross-overs 134.

A wireline logging facility 206 collects measurements from the logging tool 132, and includes computing facilities 208 for managing logging operations, acquiring and storing the measurements gathered by the wireline logging tool 202, and optionally processing the measurements for display to a user. For the logging environments of FIGS. 1 and 2, measured parameters can be recorded and displayed in the form of a log, i.e., a two-dimensional graph showing the measured parameter as a function of tool position or depth.

Alternatively, some or all of the processing can be performed downhole and the measurements can be recorded uphole, downhole, or both using electronics housed in the logging tool 132 as known in the art. It will be understood that alternative means can be employed for communicating the collected measurements to the surface as the precise form of communication is immaterial to the implementation of the invention.

The NMR logging tool 132 includes NMR components configured to perform NMR measurements on a sensitive volume in the formations 116. The sensitive volume has a generally toroidal shape surrounding the borehole 114.

Figure 3:
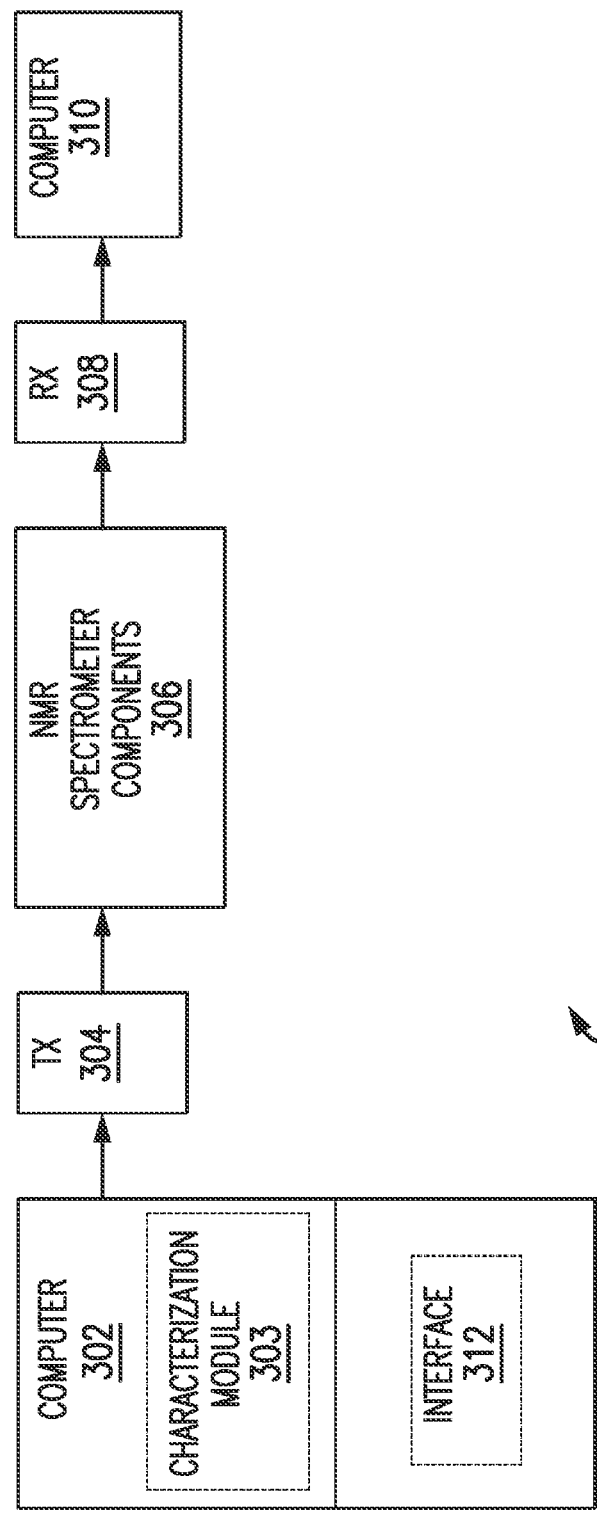
FIG. 3 shows a block diagram of an illustrative NMR logging system, in accordance with particular embodiments of the present disclosure.

FIG. 3 shows a block diagram of an illustrative NMR logging system 300. The NMR logging system 300 includes a computer 302 that stores and executes the characterization module 303 and the interface 312. The characterization module 303 performs reservoir characterization operations as described herein. The interface is configured to receive one or more datasets described below. The computer 302 is configured to provide commands, programming, and/or data to a transmitter 304. The transmitter 304 may include a pulse programmer, a radio frequency (RF) synthesizer, a phase shifter, a pulse gate, an amplifier, and/or other components to control the pulsed magnetic field for NMR logging operations, including the characterization operations described herein.

The NMR logging system 300 also includes NMR spectrometer components 306 used for NMR logging operations. Examples of NMR spectrometer components 306 include one or more magnets, shim coils, probes/antennas, and/or field-frequency lock components. Further, the NMR spectrometer components 306 may include a duplexer that enables separation between transmission current and reception current. The receiver 308 of NMR logging system 300 is configured to receive and decode NMR signals. The receiver 308 may include an analog-to-digital converter (ADC), filters, mixers, splitters, pre-amplifiers, and/or other components to receive NMR signals and recover measurement data. The recovered measurement data is output from the receiver 308 to a computer 310 for storage and analysis. The computers 302 and 310 illustrated for the NMR logging system 300 may be the same computer or may be different computers.

The NMR spectrometer components 306 are configured to generate, upon actuation, a static magnetic field having a decreasing field strength or magnitude with increasing radial distance from the NMR tool in the sensitive volume. A RF coil or antenna is used to produce pulsed RF fields substantially orthogonal to the static field in the sensitive volume. The nuclear spins in the sensitive volume align themselves partly along the static magnetic field, applied by the spectrometer components 306, forming a macroscopic nuclear magnetization. A pulsed RF field is applied to tip the nuclear magnetization into the transverse plane, resulting in a precession of the magnetization. Such a tipping pulse is followed by a series of refocusing pulses and the resulting series of pulse echoes (also referred to as spin echoes or NMR signals) is detected by the receiver 308.

Figure 14A:
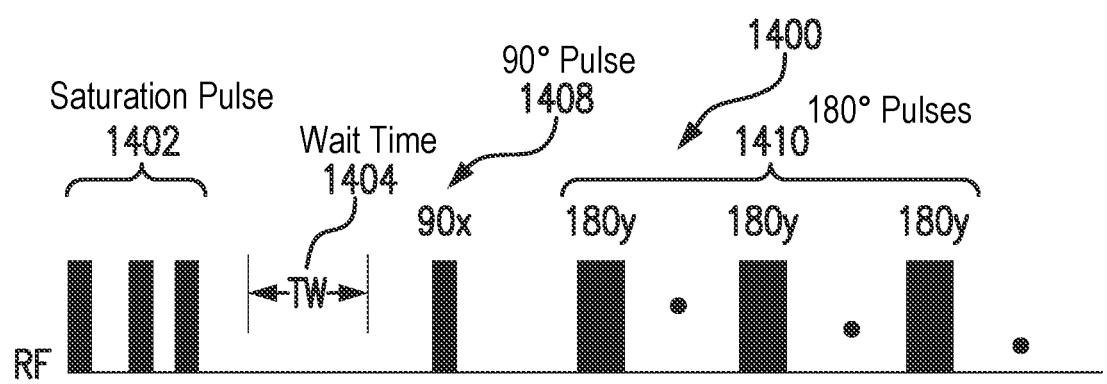
FIGS. 14A and 14B show illustrative pulse and inversion sequences.
Figure 14B:
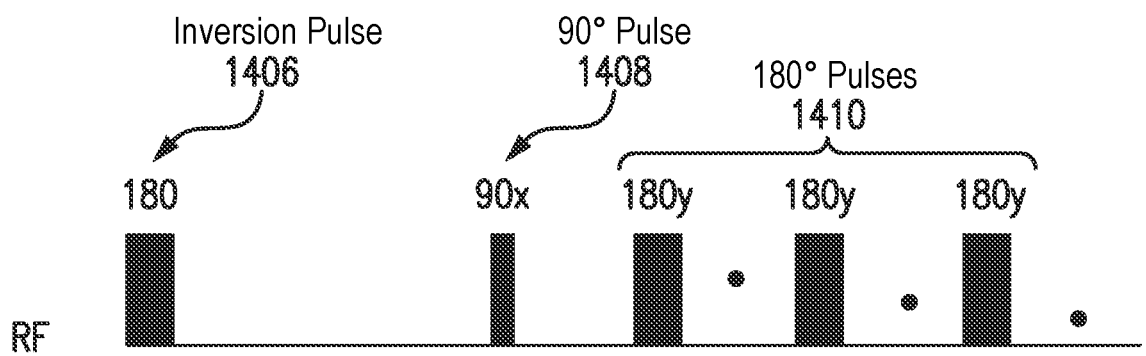

The pulse sequences may be in the form of a saturation recovery (or inversion recovery) followed by Carr-Purcell-Meiboom-Gill (CPMG) sequence or, alternatively, an optimized rephasing pulse sequence (ORPS). FIGS. 14A and 14B show an illustrative pulse sequence with a saturation pulse 1402 and an inversion pulse 1406, respectively. Also, various time intervals are illustrated for the pulse sequences, including: a wait time (TW) 1404 between the saturation pulse and the inversion pulse, in operation, the saturation pulse 1402 places the target nuclei in an essentially demagnetized state. After TW 1404 in which the nuclei begin to repolarize parallel to the static field, the inversion pulse 1406 is applied to invert the (partial) polarization along the z-axis. NMR measurements dataset comprising one or more NMR measurements is secured using a standard CPMG sequence, in which a 90° pulse 1408 is followed by a sequence of 180° pulses 1410 to generate echo signals (not shown in FIGS. 14A-14B). The $T_1$ and $T_2$ measurements can be derived from the echo signal amplitudes. In various embodiments, the time intervals can each be varied to improve measurement sensitivity and robustness. Further, through the use of gradients and frequency variation, the NMR measurements dataset can further be spatially resolved.

ORPS is similar to CPMG but the pulse widths are optimized for the actual field distributions of the static and alternating fields. The alternative sequence may be used to maximize signal and minimize RF power consumption. The NMR measurements include a longitudinal relaxation time constant (referred to as $T_1$) and a transverse relaxation time constant (referred to as $T_2$). The term "relaxation" relates to the nuclear magnetization processing towards equilibrium. From the NMR measurements dataset, a distribution of transverse relaxation time constants (referred to as a $T_2$ distribution) is obtained. The $T_2$ distribution relates amplitude to $T_2$ or a function of $T_2$ such as a logarithmic function.

In various embodiments, upon detecting at least some NMR signals (measurements), the NMR logging tool 132 stores the collected measurements as at least one NMR measurement dataset.

Figure 4:
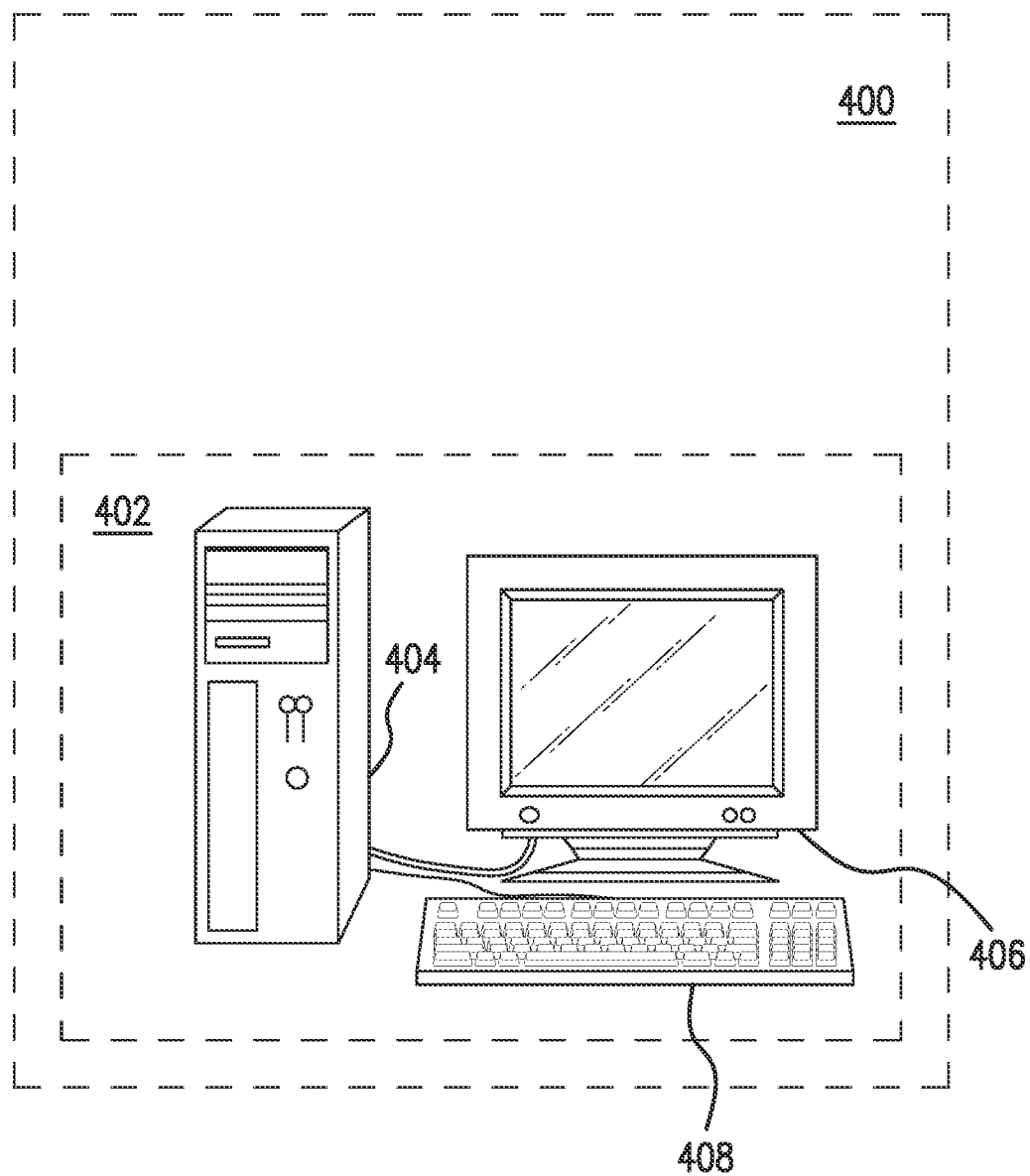
FIG. 4 shows an illustrative information processing system for managing logging operations, in accordance with particular embodiments of the present invention.

FIG. 4 shows an illustrative information processing system 400 for managing logging operations. The information processing system 400 may correspond to, e.g., an onsite logging facility for the drilling rig of FIG. 1, the computing facilities 208 of the wireline logging facility 206 of FIG. 2, or a remote computing system that receives logging measurements from such logging facilities. The information processing system 400 may include wired or wireless communication interfaces (i.e., the interface 312) receiving such logging measurements. As shown, the illustrative information processing system 400 comprises user workstation 402 with a computer chassis 404 coupled to a display device 406 and a user input device 408. The computer chassis 404 comprises a processor. The processor may include, for example a microprocessor, microcontroller, digital signal processor (DSP), application specific integrated circuit (ASIC), or any other digital or analog circuitry configured to interpret and/or execute program instructions and/or process data. The processor is communicatively coupled to a memory and configured to interpret and/or execute program instructions or data retrieved and stored in the memory. Program instructions or data may constitute portions of the characterization module 303 for carrying out reservoir characterization operations, as described herein, and for directing logging operations of a NMR logging tool (e.g., NMR logging tool 132) using the characterization, as described herein. The memory may include any system, device, or apparatus configured to hold and/or house one or more memory modules; for example, the memory may include read-only memory, random access memory, solid state memory, or disk-based memory. Each memory module may include any system, device or apparatus configured to retain program instructions and/or data for a period of time (e.g., computer-readable non-transitory media). For example, instructions from the characterization module 303 may be retrieved and stored in the memory for execution by the processor.

As noted above, the NMR signals include $T_1$ and $T_2$. Another measurement parameter used in NMR well logging is the formation diffusion. Generally, diffusion refers to the motion of atoms in a gaseous or liquid state due to their thermal energy. The diffusion parameter is dependent on the pore sizes of the formation and offers much promise as a separate permeability indicator. In a uniform magnetic field, diffusion has little effect on the decay rate of measured NMR echoes. In a gradient magnetic field, however, diffusion causes atoms to move from their original positions to new ones, which moves also cause these atoms to acquire different phase shifts compared to atoms that did not move, and will thus contribute to a faster rate of relaxation. Therefore, in gradient magnetic field diffusion is a logging parameter which can provide independent information about the structure of the geologic formation of interest, the properties of the fluids in it, and their interaction. Without diffusion, indirect echoes decay either slower or at the same rate as direct echoes. With very fast diffusion, however, indirect echoes drop out faster than direct ones.

In the fast diffusion regime, $T_1$ and $T_2$ of the fluids in porous media can be described by the equations (the instrument and internal gradients are negligible):

$$\frac{1}{T_{1,2}} = \frac{1}{T_{1,2}^{bulk}} + \rho_{1,2} \frac{2\alpha}{d_{pore}}, \quad (1)$$

where $T_{1,2}$ is the measured longitudinal and transverse relaxation time, $T_{1,2}^{Bulk}$ is the longitudinal and transverse bulk relaxation time of the fluid, $\rho_{1,2}$ is the longitudinal and transverse surface relaxivities, $d_{pore}$ is the pore diameter, and $\alpha$ is the shape factor ($\alpha=1$, 2 and 3), for slit, cylindrical, and spherical pores.

A substantial number of underground formations consist of carbonate rocks, that is rocks which contain predominantly carbonate minerals, notably limestones which consist primarily of calcite (calcium carbonate) and dolomites which contain both dolomite (calcium magnesium carbonate) and calcite. For these rocks, the shape factor, $\alpha$, also includes additional surface roughness factor that is generally mineralogy dependent. It is also noted that the shape factor value a is empirical and lithology specific. Therefore, the $T_1/T_2$ ratio can be expressed as equation (2):

$$\frac{T_1}{T_2} = \frac{\frac{1}{T_2^{Bulk}} + \rho_2 \frac{2\alpha}{d_{pore}}}{\frac{1}{T_1^{bulk}} + \rho_1 \frac{2\alpha}{d_{pore}}} = 1 + \frac{\rho_2 - \rho_1}{\rho_1} \frac{T^B}{\frac{d_{pore}}{2\alpha\rho_1} + T^B} \quad (2)$$

where ($T_1^{Bulk} = T_2^{Bulk} = T^B$).

In the limit of small pore sizes, i.e., $$\frac{d_{pore}}{2\alpha\rho_1} \ll T^B,$$

equation (2) can be simplified to $$\frac{T_1}{T_2} = \frac{\rho_2}{\rho_1}.$$

In the limit of large pore sizes, i.e., $$\frac{d_{pore}}{2\alpha\rho_1} \gg T^B, \frac{T_1}{T_2} = 1.$$

Considering the pore body—to—pore throat ratio (BTR, $d_{pore} = d_{throat} \times BTR$), the above relationship is still valid, i.e. as the pore throat decreases, the $T_1/T_2$ ratio changes from 1 to $\rho_2/\rho_1$.

In this context, the $T_1/T_2$ ratio is a function of the sizes of the pores that the fluid occupies, which is also formation dependent. In other words, equation (2) demonstrates that for a given $\rho$, the $T_1/T_2$ ratio and the pore size, d, are completely interchangeable.

Figure 5:
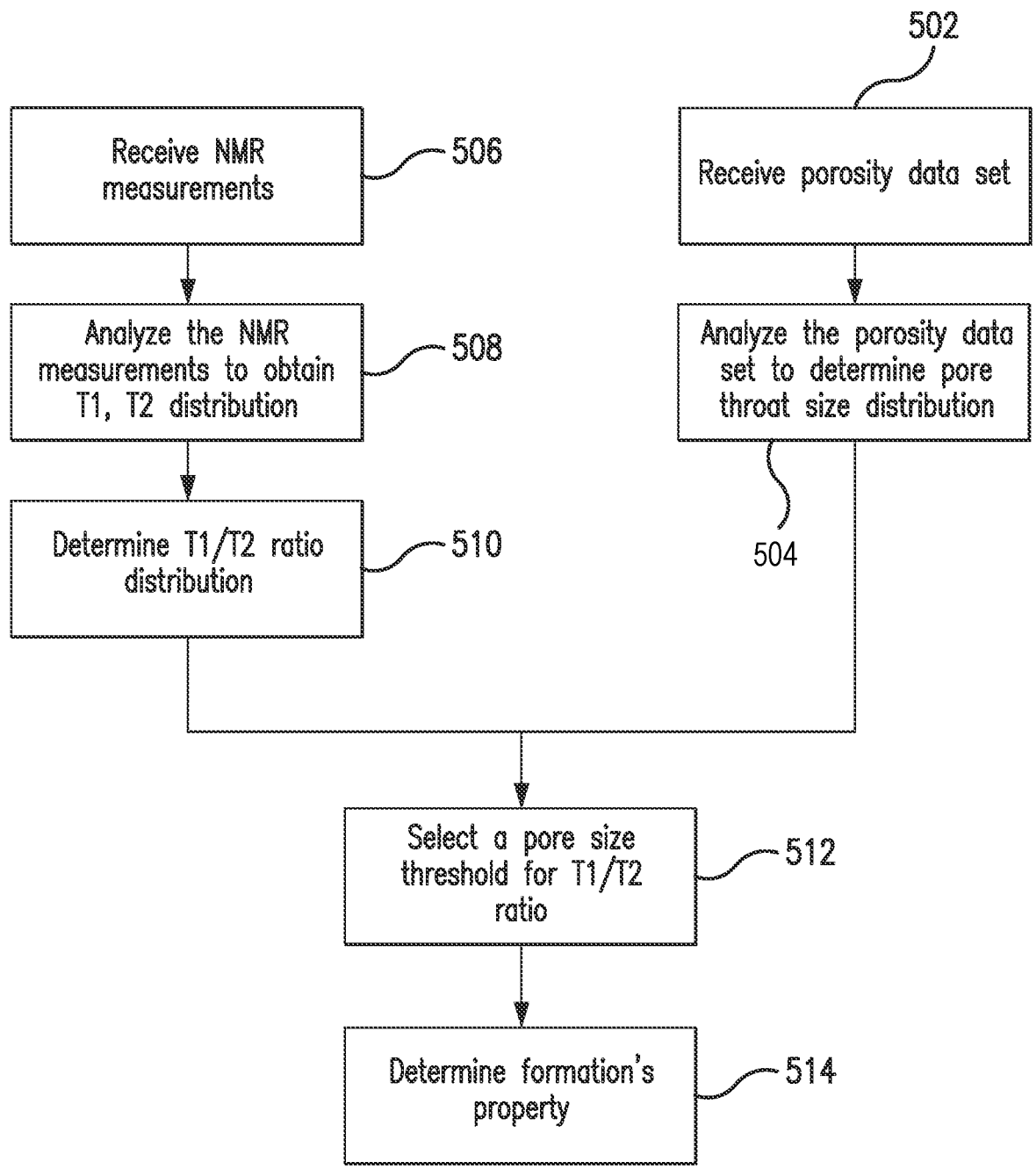
FIG. 5 is a flow diagram depicting a process of reservoir formation characterization from NMR $T_1/T_2$ ratio in accordance with one embodiment of the present disclosure.

FIG. 5 is a flow diagram depicting a process of reservoir formation characterization from NMR $T_1/T_2$ ratio in accordance with one embodiment of the present disclosure. Before turning to description of FIG. 5, it is noted that the flow diagram in FIG. 5 shows examples in which operational steps are carried out in a particular order, as indicated by the lines connecting the blocks, but the various steps shown in this diagram can be performed in any order, or in any combination or sub-combination. It should be appreciated that in some embodiments some of the steps described below may be combined into a single step. In some embodiments, one or more steps may be omitted. In some embodiments, one or more additional steps may be performed. As will be appreciated by one skilled in the art, aspects of the present disclosure may be embodied as a method or computer program product. In some embodiments, the method described below may be performed, at least in part, by characterization software module 303 depicted in FIG. 3.

According to an embodiment of the present disclosure, at step 502, the characterization module 303 may receive at least one dataset describing fluid particles in the pores through the interface 312. In various embodiments, the dataset describing at least a fluid surface relaxivity of each of the particles may include at least mercury injection capillary pressure (MICP) data, micro CT scan measurement data, porosity, permeability, and grain density data obtained from a plurality of samples taken from a subsurface reservoir. For instance, this data may be obtained using a MICP measurement device to acquire one or more datasets from the plurality of core samples, the dataset comprising at least mercury injection capillary pressure, porosity, permeability, and grain density data. Any MICP measurement devices known to those of skill in the art may be used. In this exemplary embodiment, the characterization module 303 may further generate a MICP curve. The shape of the MICP curve reflects characteristics of a rock's porosity network, such as the distribution of pore sizes and interconnectivity of the pores.

Next, at step 504, the characterization module 303 may further analyze the dataset received in step 502 to determine pore throat size distribution. Pore systems are made up of relatively large pores connected by smaller pores (pore throats). Pore size is typically measured as the diameter of the largest sphere that can fit in a pore, whereas pore-throat size is the diameter of the smallest disk or sphere that can be placed in the throats between pores. However, there is no universal standard to define the pore size cut-off values. For example, complex pore types in carbonate rocks may be described by the following definitions: micropores for pores smaller than approximately 0.002 mm (2 microns); mesopores for pores that range in size from approximately 0.002 to approximately 0.010 mm (2 to 10 microns); and macropores for pores larger than approximately 0.01 mm (10 microns). In one embodiment, the characterization module 303 may also sort the pore throat sizes. Realizing that rocks of differing pore systems yield differently shaped capillary pressure curves, then representing the capillary pressure curve with a set of parameters that embodies these differences provides a means to easily group, or classify rocks according to unique combinations of these model parameters. Because the pore network governs the movement of fluids, the model can be used for saturation height analysis and permeability prediction.

At step 506, the characterization module 303 receives at least one NMR measurements dataset obtained by NMR measurements related to the diffusion and relaxation properties of fluid samples and carried out by the logging tool (i.e., the NMR logging tool 132), as described above in conjunction with FIG. 3. Because these properties are generally dependent upon the formation matrix pore size distribution, they can provide means for determining the relative proportion of pore sizes in the formation that is important for determining the monetary value of the reservoir and also essential for making well completion decisions.

According to an embodiment of the present invention, at step 508, the $T_1$ and $T_2$ measurements obtained in step 506 are processed by the characterization module 303 to derive petrophysical properties of geological formations 116. As known in the art, these measurements can be used to compute distributions of $T_1$ and $T_2$ relaxation times. The resultant distributions of $T_1$ and $T_2$ relaxation times comprise data points of $T_1$ and $T_2$ relaxation curves. The characteristic $T_1$ or $T_2$ times of the surface-wetting phase can also be used to estimate formation permeability as described below.

Next, at step 510, the characterization module 303 determines $T_1/T_2$ ratio by first calculating $T_1$ geometric mean at the certain $T_2$ value on $T_1$-$T_2$ map and then calculating the ratio between $T_1$ geometric mean and the corresponding $T_2$. Furthermore, as noted above, equation (2) demonstrates that for a given p, the $T_1/T_2$ ratio and the pore size, d, are completely interchangeable.

Figure 6:
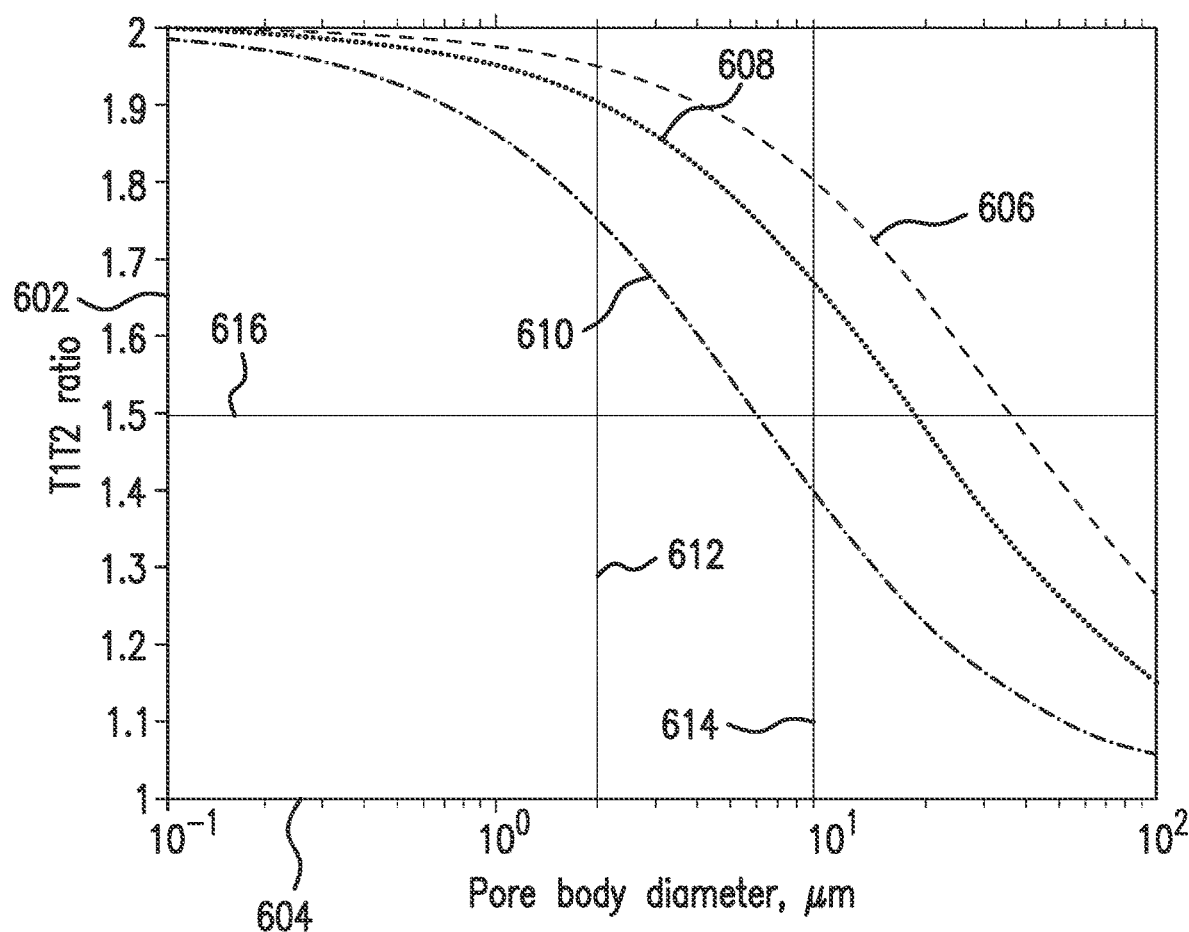
FIG. 6 illustrates plots showing the relationship between $T_1/T_2$ ratio and pore size for the slit pore system where $\rho_2/\rho_1=2$.

FIG. 6 includes plots showing $T_1/T_2$ ratio distribution with respect to pore size for a sample of slit-shaped pores when $$\frac{\rho_2}{\rho_1} = 2.$$

The vertical axis 602 indicates the ratio $T_1/T_2$, and the horizontal axis 604 indicates pore size. Slit-shaped pores sample implies that the sizes in FIG. 6 are associated with the height of the slits. Plots 606, 608 and 610 correspond to distributions with transverse surface relaxivities values $\rho_1$ equal to 1 μm/s, 3 μm/s and 6 μm/s, respectively. The two vertical lines 612 and 614 in FIG. 6 are the pore size boundaries to identify microporous, mesoporous and macroporous material layers in carbonates.

Figure 7:
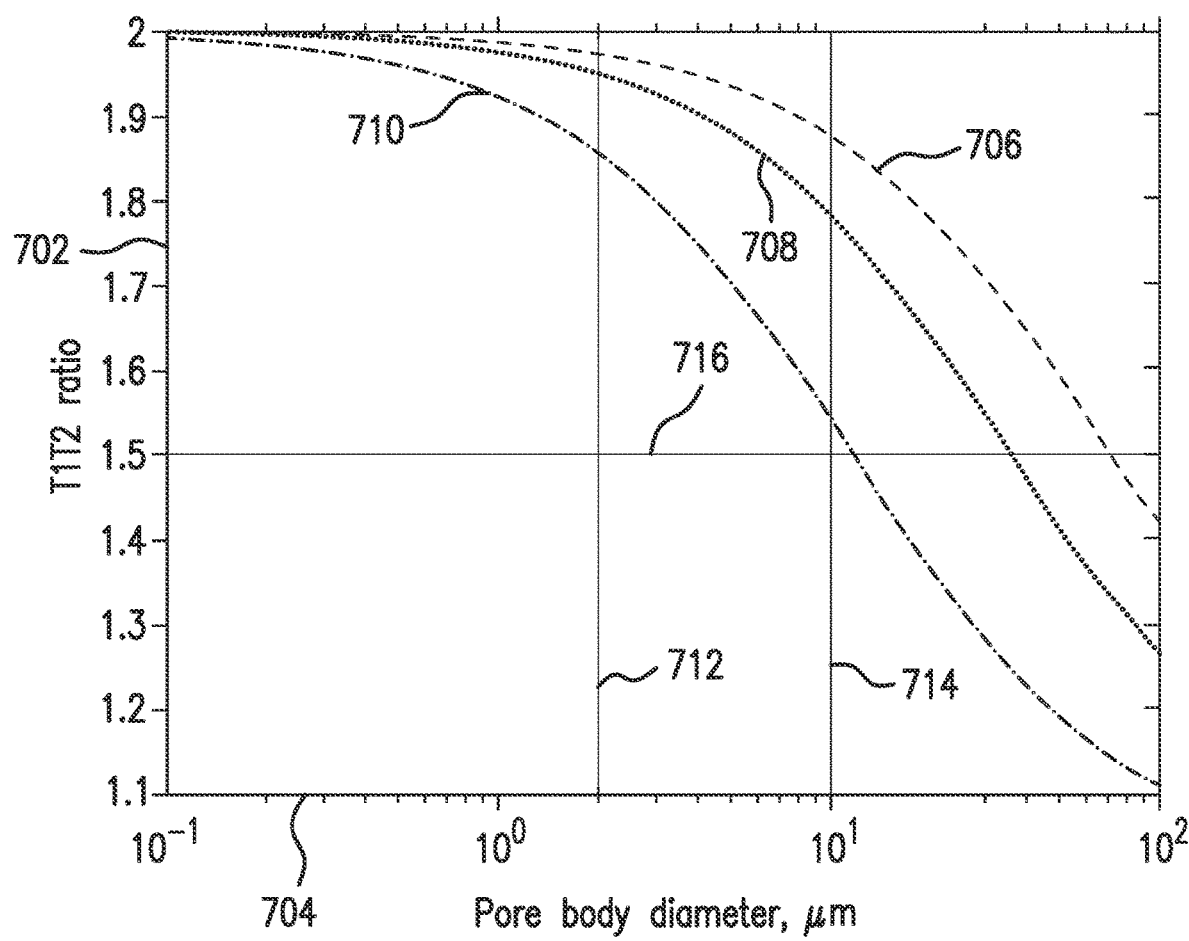
FIG. 7 illustrates plots showing the relationship between $T_1/T_2$ ratio and pore size for the cylindrical pore system where $\rho_2/\rho_1=2$.

FIG. 7 includes plots showing $T_1/T_2$ ratio distribution with respect to pore size for a sample of substantially cylindrical-shaped pores when $$\frac{\rho_2}{\rho_1} = 2.$$

The vertical axis 702 indicates the ratio $T_1/T_2$, and the horizontal axis 704 indicates pore size. Cylindrical-shaped pores sample implies that the sizes in FIG. 7 are associated with the diameter of the cylinders. Plots 706, 708 and 710 also correspond to distributions with transverse surface relaxivities values $\rho_1$ equal to 1 μm/s, 3 μm/s and 6 μm/s, respectively. The two vertical lines 712 and 714 in FIG. 7 are the pore size boundaries to identify microporous, mesoporous and macroporous material layers in carbonates.

Figure 8:
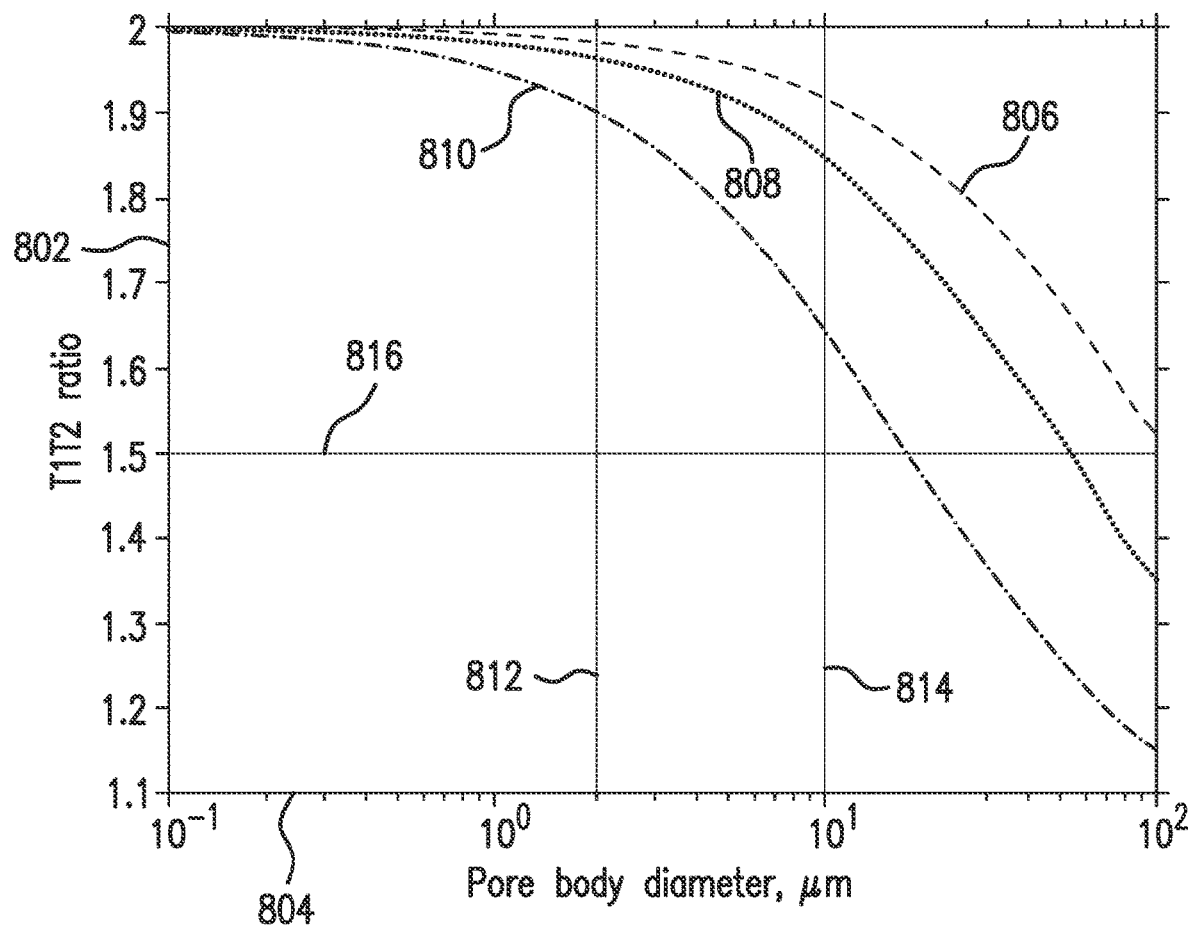
FIG. 8 illustrates plots showing the relationship between $T_1/T_2$ ratio and pore size for the spherical pore system where $\rho_2/\rho_1=2$.

FIG. 8 includes plots showing $T_1/T_2$ ratio distribution with respect to pore size for a sample of substantially spherical-shaped pores when $$\frac{\rho_2}{\rho_1} = 2.$$

The vertical axis 802 indicates the ratio $T_1/T_2$, and the horizontal axis 804 indicates pore size. Spherical-shaped pores sample implies that the sizes in FIG. 8 are associated with the diameter of the spheres. Plots 806, 808 and 810 correspond to distributions with transverse surface relaxivities values $\rho_1$ equal to 1 μm/s, 3 μm/s and 6 μm/s, respectively. The two vertical lines 812 and 814 in FIG. 8 are the pore size boundaries to identify microporous, mesoporous and macroporous material layers in carbonates.

Figure 9:
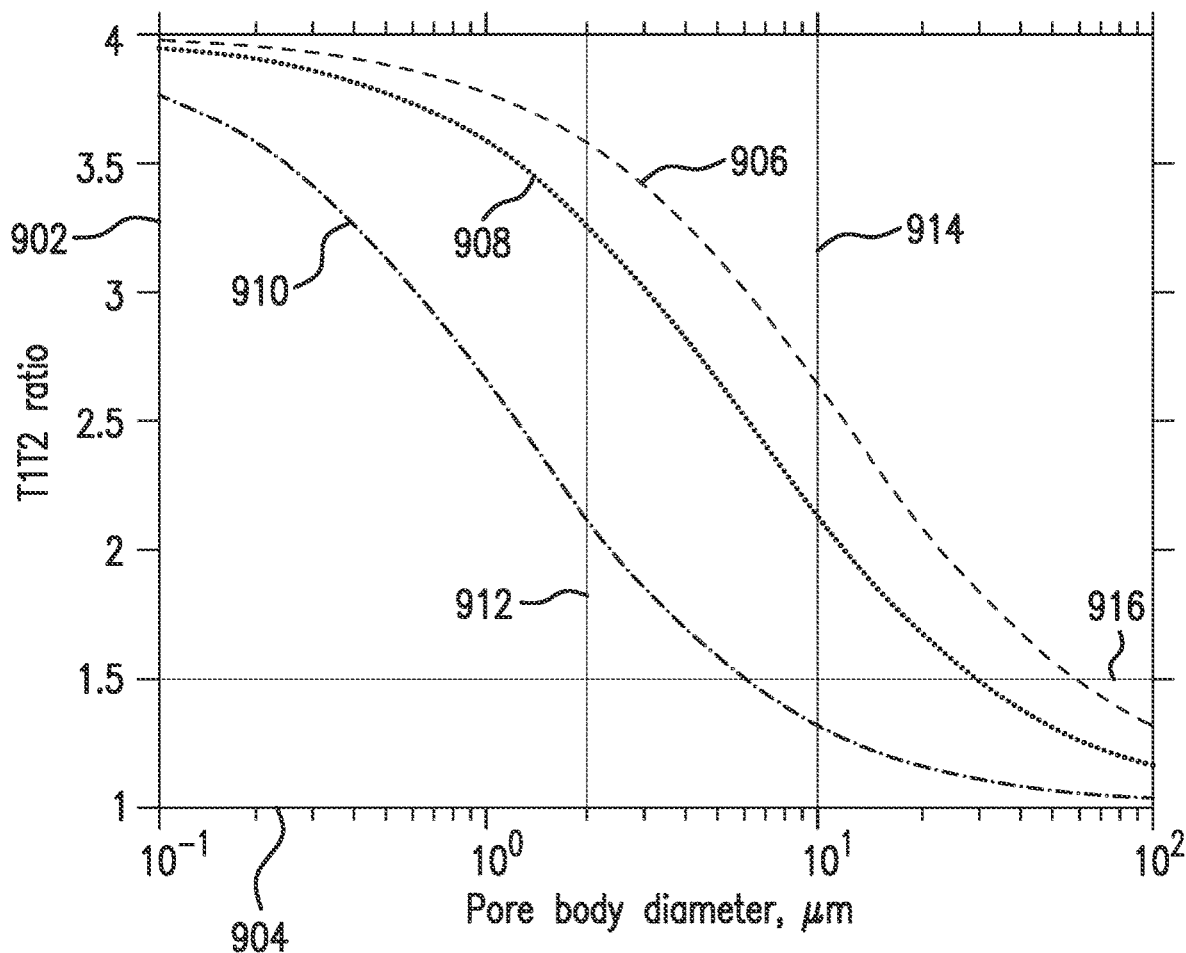
FIG. 9 illustrates plots showing the relationship between $T_1/T_2$ ratio and pore size for the cylindrical pore system where $\rho_2/\rho_1=4$.

FIG. 9 includes plots showing $T_1/T_2$ ratio distribution with respect to pore size for a sample of substantially cylindrical-shaped pores when $$\frac{\rho_2}{\rho_1} = 4.$$

Plots 906, 908 and 910 yet again correspond to transverse surface relaxivities values $\rho_1$ equal to 0.1 μm/s, 0.5 μm/s and 1 μm/s, respectively. The two vertical lines 912 and 914 in FIG. 9 are the pore size boundaries to identify microporous, mesoporous and macroporous material layers in carbonates.

It should be noted that given equation (2), function f ($T_1/T_2$) can be expressed in terms of f (d) to derive the pore type groups for petrophysical rock typing. As mentioned above, permeability is the property of the subterranean rock formation, which depends upon the manner in which the pores are interconnected and is controlled by subterranean formation's porosity and pore throats. In the typical oil reservoir, when pore throats are too small, the fluid encountering those pore throats will contribute minimally to the permeability. Therefore, not all pores contribute to the permeability. For example, a pore throat having a size below sub-micrometer does not contribute too much to the permeability. Thus, microporosity can be ignored in a permeability calculation.

According to an embodiment of the present invention, the characterization module 303 selects a threshold value for the $T_1/T_2$ ratio (also known as $T_1/T_2$ ratio cutoff) indicating pore sizes not contributing to the permeability of the formation. Referring back to FIG. 5, in order to improve permeability estimation, at step 512, the characterization module 303 selects the $T_1/T_2$ ratio threshold value, where only the porosity with $T_1/T_2$ ratio below the selected threshold will be considered for the porosity-permeability correlation described below. For example, in FIGS. 6-9, an exemplary threshold value for the $T_1/T_2$ ratio approximately equal to 1.5 is shown as horizontal lines 616, 716, 816 and 916, respectively.

Most commonly used empirical NMR permeability models, such as the Timur-Coates or the geometric mean (e.g., T2GM)) model, are in simple mathematical forms, and rely on the assumption that linear or quasi-linear correlations exist between NMR relaxation time and pore throat size distribution. These NMR permeability models are derived from Kozeny-Carman type relationship for permeability expressed by equation (3) below, which is in turn derived from the bundle of capillary tubes model:

$$k = \frac{\emptyset r^2}{a\tau}, \quad (3)$$

where r is the hydraulic radius, r is the tortuosity, Ø is the porosity of the formation and a is the shape factor. All of the above mentioned permeability correlations are based on Archie's empirical equation, where the tortuosity and porosity follow a power law relationship. In contrast, various embodiments of the present invention consider the logarithmic relationship between tortuosity and porosity based upon a theoretical study on diffusivity of a model porous system composed of freely overlapping spheres described by Weissberg in Journal of Applied Physics 34, 2636 (1963). More specifically, equations (4) and (5) describe these logarithmic correlations:

$$\log(k) = a + b*\log(\emptyset) + c\frac{\emptyset_{<T1/T2 \text{ threshold}}}{\emptyset} \text{ and} \quad (4)$$

$$\log(k) = a + b*\log(\emptyset) + c*\log(T_{2GM}) + d\frac{\emptyset_{<T1/T2 \text{ threshold}}}{\emptyset}, \quad (5)$$

where k is the permeability of the formation, φ is the total porosity of the formation, $\emptyset_{<T1/T2threshold}$ is the porosity with $T_1/T_2$ ratio less than $T_1/T_2$ ratio threshold, $T_{2GM}$ is the $T_2$ geometrical mean and a, b, c and d represent best fitting coefficients for equation (5). It should be noted that when b is set to 0, the above equation (5) becomes equation (6):

$$\log(k) = a' + b'*\log(\emptyset) + c*\log(T_{2GM}) + d'\frac{\emptyset_{<T1/T2 \text{ threshold}}}{\emptyset}, \quad (6)$$

wherein a', b', c' and d' represent best fitting coefficients for equation (6).

Referring back to FIG. 5, according to an embodiment of the present invention, at step 514, the characterization module 303 determines permeability of the formation by performing porosity-permeability correlation using equations (4) and/or (5) above.

Figure 10:
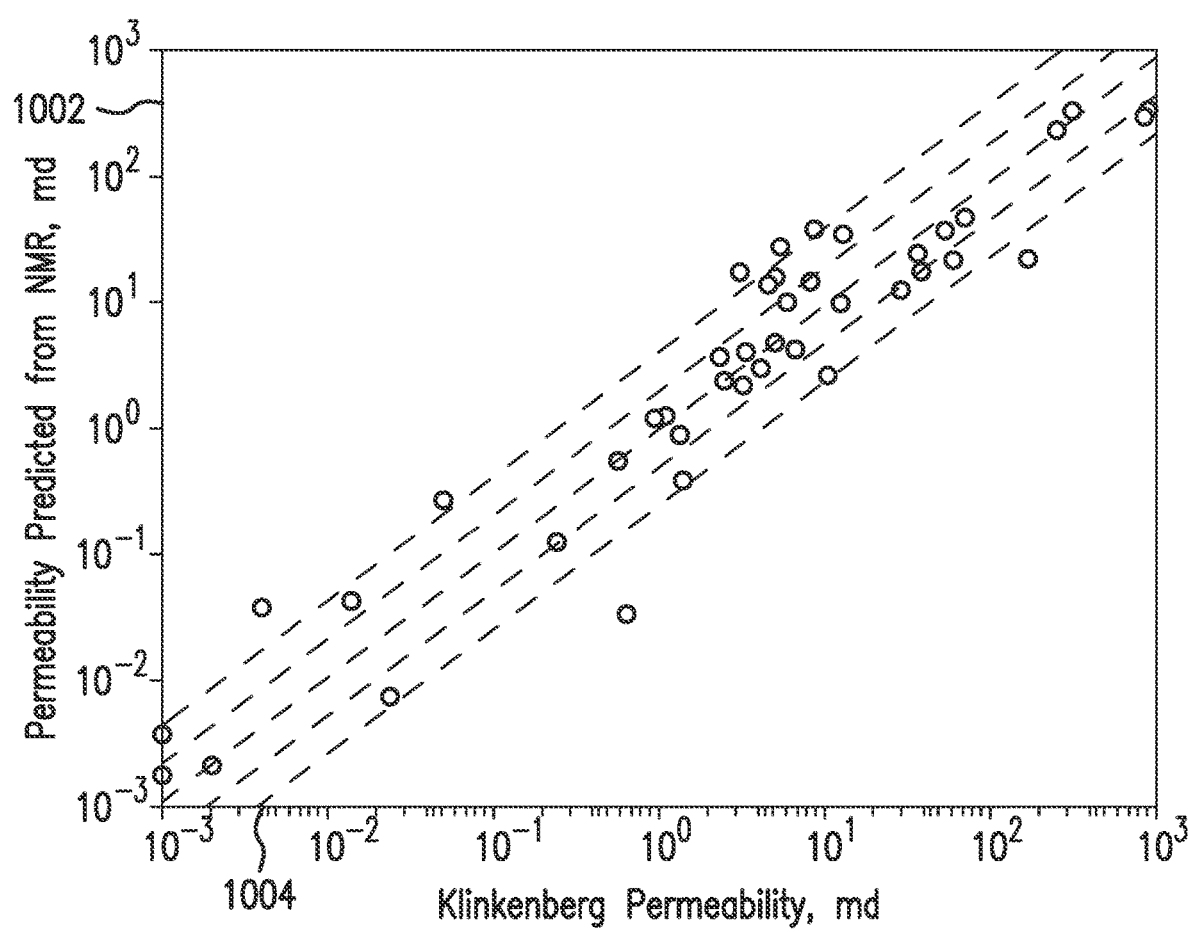
FIGS. 10 and 11 are plots of permeability prediction from NMR data using embodiments of the present invention.
Figure 11:
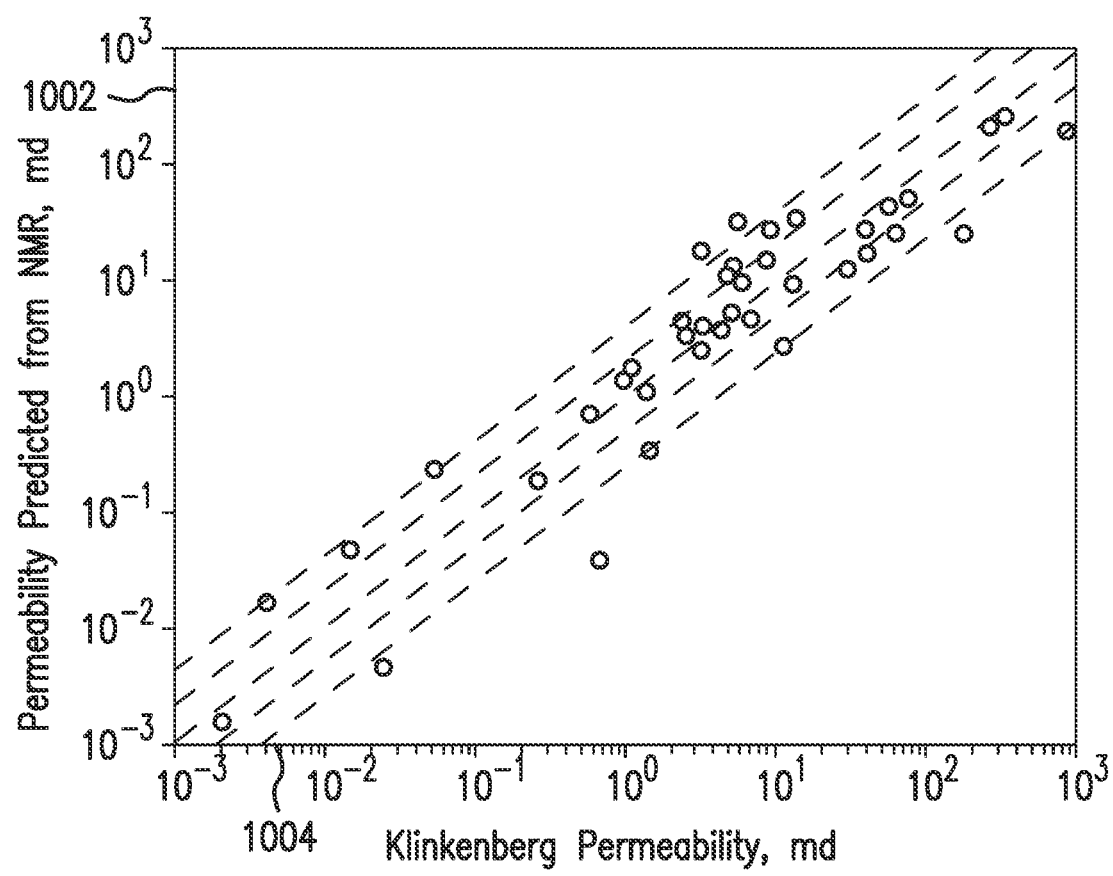

FIGS. 10 and 11 show the permeability prediction that is obtained from NMR data using equations (4) and (5), respectively, where the $T_1/T_2$ ratio threshold value is approximately equal to 1.5, according to embodiments of the present invention. In FIGS. 10 and 11, permeability predicted from NMR is plotted on the vertical axis 1002 and Klinkenberg correction to permeability is plotted on the horizontal axis 1004. As can be seen here, the predicted permeabilities using embodiments of the present invention match very well with lab-measured results with at most four orders of magnitude difference for the permeability range spanning 6 orders of magnitude.

Figure 12:
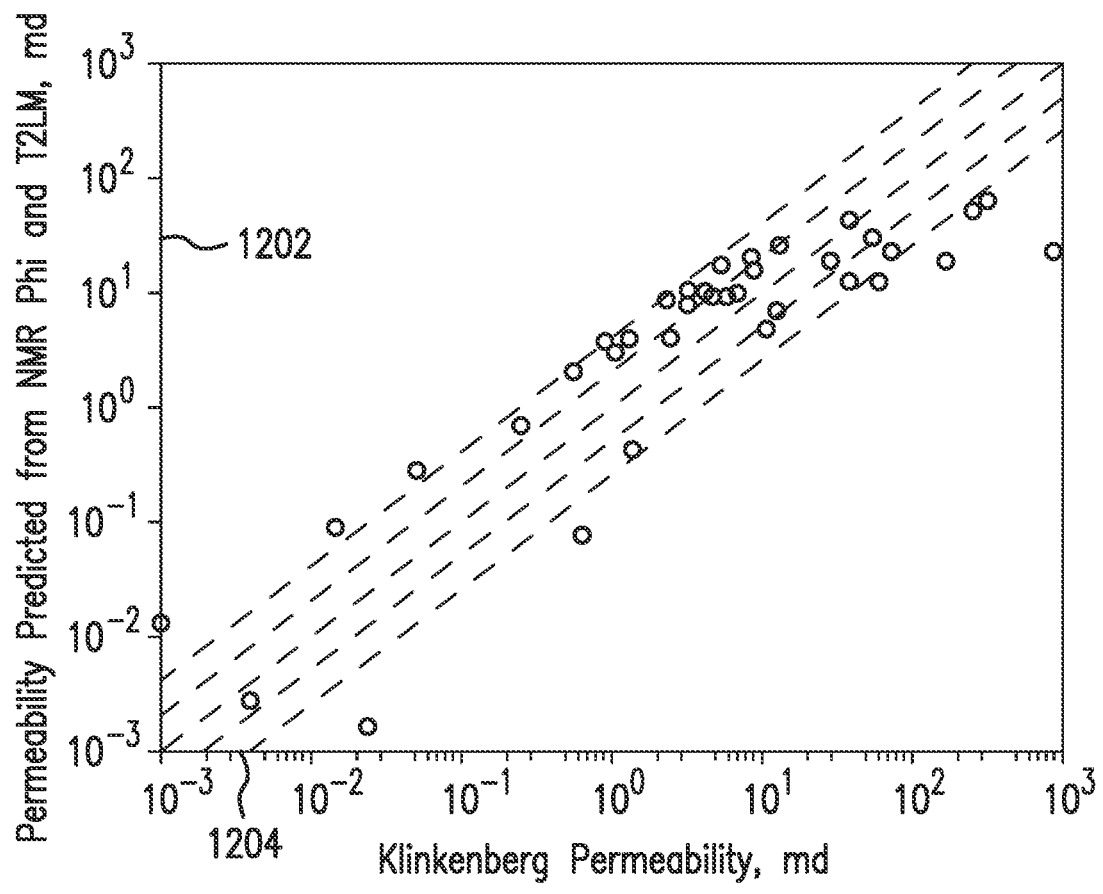
FIG. 12 is a plot of permeability prediction from NMR data using conventional T2GM method.

FIG. 12 is a plot of permeability prediction from NMR data where the $T_1/T_2$ ratio threshold value is approximately equal to 1.5, using conventional T2GM method. In FIG. 12, permeability predicted from NMR, porosity data and a logarithmic mean $T_2$ (T2LM) is plotted on the vertical axis 1202 and Klinkenberg correction to permeability is plotted on the horizontal axis 1204. As can be seen in FIG. 12, the predicted permeabilities using conventional techniques only shows the good correlation within 2 orders of permeability magnitude.

Figure 13:
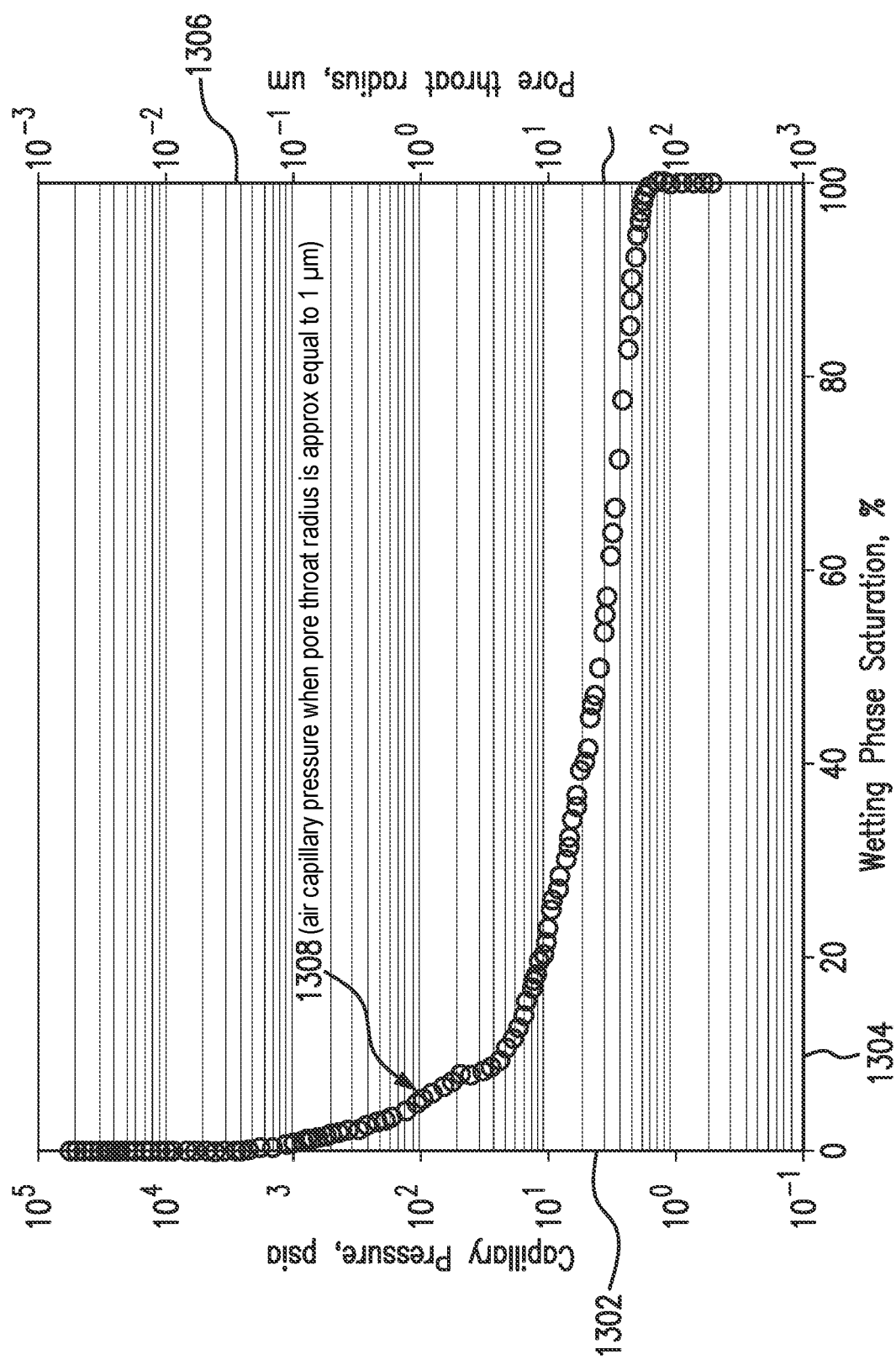
FIG. 13 illustrates the results of mercury injection capillary pressure (MICP) laboratory experiments on carbonate reservoir core samples.

FIG. 13 illustrates the results of MICP laboratory experiments on carbonate reservoir core samples. In FIG. 13, capillary pressure is plotted on the axis 1302, percentage of wetting phase saturation is plotted on the axis 1304, and pore throat radius is plotted on the axis 1306. The $T_1/T_2$ cutoff can be determined by integrating the measured $T_1/T_2$ ratio distribution of the water-saturated sample up to the point that the amount of pore volume is equal to the amount of volume above a certain pore throat size. For example, when pore throat radius is approximately equal to 1 μm, the mercury—air capillary pressure at point 1308 is approximately equal to 100 psia.

Accordingly, as set forth above, the embodiments disclosed herein may be implemented in a number of ways. In general, in one aspect, the disclosed embodiments are directed to a method for estimating a property of an earth formation. The method includes, among other steps, the steps of receiving at least one porosity dataset. The method further includes the steps of: i) analyzing the at least one porosity dataset to determine at least pore-throat size distribution; ii) receiving at least one NMR measurements dataset from a nuclear magnetic resonance (NMR) tool; iii) analyzing the at least one NMR measurements dataset to determine a distribution of a first relaxation time versus a second relaxation time; iv) determining distribution of a ratio of the first relaxation time to the second relaxation time by calculating a ratio between a geometric mean of the first relaxation and the corresponding second relaxation time; v) selecting a threshold for the ratio of the first relaxation time to the second relaxation time, the threshold indicates a value of the ratio corresponding to pore sizes not contributing to property of the formation; and vi) determining the property of the formation using the determined threshold for the ratio of the first relaxation time to the second relaxation time.

In one or more embodiments, the method for estimating a property of an earth formation further includes any one of the following features individually or any two or more of these features in combination: (a) the property is permeability; (b) the first relaxation time is a longitudinal relaxation time and the second relaxation time is a transverse relaxation time; (c) the at least one porosity dataset includes information describing fluid particles in the pores, the threshold pressure measurement is a pore throat size measurement and the information includes at least a fluid surface relaxivity of each of the particles; (d) the step of determining the distribution of the ratio of the first relaxation time to the second relaxation time further includes determining a ratio of a first fluid surface relaxivity to a second fluid surface relaxivity when the pore throat size is below approximately 1 μm; (e) the first fluid surface relaxivity is a longitudinal surface relaxivity and the second surface relaxivity is a transverse surface relaxivity; (f) the step of determining the property of the formation further includes performing correlation analysis between the permeability of the formation and total porosity of the formation; and (g) the step of performing correlation analysis further includes evaluating an equation:

$$\log(k) = a + b*\log(\emptyset) + c*\log(T_{2GM}) + d\frac{\emptyset_{<\frac{T1}{T2}threshold}}{\emptyset}$$

wherein k represents the permeability of the formation, Ø represents the total porosity of the formation, $$\emptyset_{<\frac{T1}{T2}threshold}$$

represents porosity of a portion of the formation having the determined ratio of the first relaxation time to the second relaxation time less than the selected threshold, $T_{2Gm}$ represents geometrical mean of the analyzed second relaxation time values, a, b, c, and d represent best fitting coefficients for the equation.

In general, in yet another aspect, the disclosed embodiments are directed to an apparatus for estimating a property of an earth formation. The apparatus includes, among other things, a nuclear magnetic resonance (NMR) formation evaluation tool configured to perform NMR measurements on a sensitive volume in the formation. The apparatus further includes an information processing system. The information processing system includes a processor and a memory device coupled to the processor. The memory device contains a set of instructions that, when executed by the processor, cause the processor to receive at least one porosity dataset from the interface. The set of instructions, when executed by the processor, further cause the processor to i) analyze the at least one porosity dataset to determine at least pore-throat size distribution; ii) receive at least one NMR measurements dataset from the NMR tool; iii) analyze the at least one NMR measurements dataset to determine a distribution of a first relaxation time versus a second relaxation time; iv) determine distribution of a ratio of the first relaxation time to the second relaxation time by calculating a ratio between a geometric mean of the first relaxation time and the corresponding second relaxation time; v) select a threshold for the ratio of the first relaxation time to the second relaxation time, the threshold indicates a value of the ratio corresponding to pore sizes not contributing to property of the formation; and vi) determine the property of the formation using the determined threshold for the ratio of the first relaxation time to the second relaxation time.

In one or more embodiments, the apparatus may further include any of the following features individually or any two or more of these features in combination: a) the property is permeability; (b) the first relaxation time is a longitudinal relaxation time and the second relaxation time is a transverse relaxation time; (c) the at least one porosity dataset includes information describing fluid particles in the pores, the threshold pressure measurement is a pore throat size measurement and the information includes at least a fluid surface relaxivity of each of the particles (d) the set of instructions that cause the processor to determine the distribution of the ratio of the first relaxation time to the second relaxation time further cause the processor to determine a ratio of a first fluid surface relaxivity to a second fluid surface relaxivity when the pore throat size is below approximately 1 µm; and (e) the first fluid surface relaxivity is a longitudinal surface relaxivity and the second fluid surface relaxivity is a transverse surface relaxivity.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

What is claimed is:

1. A method for estimating a property of an earth formation, the method comprising steps of:
   receiving, at an NMR logging system, at least one porosity dataset;
   analyzing, at the NMR logging system, the at least one porosity dataset to determine at least pore-throat size distribution;
   receiving, at the NMR logging system, at least one NMR measurements dataset from a nuclear magnetic resonance (NMR) tool;
   analyzing, at the NMR logging system, the at least one NMR measurements dataset to determine a distribution of a first relaxation time versus a second relaxation time;
   determining, at the NMR logging system, distribution of a ratio of the first relaxation time to the second relaxation time by calculating a ratio between a geometric mean of the first relaxation and the corresponding second relaxation time;
   determining, at the NMR logging system, a threshold for the ratio of the first relaxation time to the second relaxation time, wherein the threshold indicates a value of the ratio corresponding to pore sizes not contributing to a permeability of the formation;
   predicting, at the NMR logging system, the permeability of the formation using ratios that are below the determined threshold for the ratio of the first relaxation time to the second relaxation time;
   selecting a method of producing hydrocarbons based on the predicted permeability of the formation; and
   producing the hydrocarbons based on the predicted permeability of the formation using the selected method.

2. The method as recited in claim 1, wherein the first relaxation time is a longitudinal relaxation time and the second relaxation time is a transverse relaxation time.

3. The method as recited in claim 1, wherein the at least one porosity dataset includes information describing fluid particles in the pores, wherein a threshold pressure measurement is a pore throat size measurement and wherein the information comprises at least a fluid surface relaxivity of each of the particles.

4. The method as recited in claim 3, wherein determining the distribution of the ratio of the first relaxation time to the second relaxation time further comprises determining a ratio of a first fluid surface relaxivity to a second fluid surface relaxivity when the pore size is below approximately 1 µm.

5. The method as recited in claim 4, wherein the first fluid surface relaxivity is a longitudinal surface relaxivity and the second surface relaxivity is a transverse surface relaxivity.

6. The method as recited in claim 2, wherein determining the property of the formation further comprises performing correlation analysis between the permeability of the formation and total porosity of the formation.

7. The method as recited in claim 6, wherein performing the correlation analysis further comprises evaluating an equation of $$\log(k) = a + b*\log(\emptyset) + c*\log(T_{2GM}) + d\frac{\emptyset_{<\frac{T1}{T2}threshold}}{\emptyset}$$

and wherein k represents the permeability of the formation, φ represents the total porosity of the formation, $$\emptyset_{<\frac{T1}{T2}threshold}$$

represents porosity of a portion of the formation having the determined ratio of the first relaxation time to the second relaxation time less than the selected threshold, $T_{2GM}$ represents geometrical mean of the analyzed second relaxation time values, a, b, c, and d represent best fitting coefficients for the equation.

8. The method as recited in claim 1, further comprising, before receiving the at least one NMR measurements dataset, performing steps of:
 disposing a logging tool in a borehole;
 actuating the NMR tool in the borehole;
 detecting NMR signals at one or more receivers in the NMR tool; and
 storing, by the NMR tool the detected NMR signals as at least one NMR measurement dataset.

9. An apparatus for estimating a property of an earth formation, the apparatus comprising:
 a nuclear magnetic resonance (NMR) formation evaluation tool configured to perform NMR measurements on a sensitive volume in the formation; and
 an information processing system communicatively coupled to the NMR formation evaluation tool, the information processing system comprising a processor and a memory device coupled to the processor, the memory device containing a set of instructions that, when executed by the processor, cause the processor to:
 receive at least one porosity dataset;
 receive at least one NMR measurements dataset from the NMR formation evaluation tool;
 analyze the at least one NMR measurements dataset to determine a distribution of a first relaxation time versus a second relaxation time;
 determine distribution of a ratio of the first relaxation time to the second relaxation time by calculating a ratio between a geometric mean of the first relaxation time and the corresponding second relaxation time;
 determine a threshold for the ratio of the first relaxation time to the second relaxation time, wherein the threshold indicates a value of the ratio corresponding to pore sizes not contributing to permeability of the formation;
 determine the property of the formation using ratios that are below the determined threshold for the ratio of the first relaxation time to the second relaxation time; and
 select a method of producing hydrocarbons based on the predicted permeability of the formation;
 wherein hydrocarbons are produced based on the predicted permeability of the formation using the selected method.

10. The apparatus as recited in claim 9, wherein the property is permeability.

11. The apparatus as recited in claim 9, wherein the first relaxation time is a longitudinal relaxation time and the second relaxation time is a transverse relaxation time.

12. The apparatus as recited in claim 9, wherein the at least one porosity dataset includes information describing fluid particles in the pores, wherein a threshold pressure measurement is a pore throat size measurement and wherein the information comprises at least a fluid surface relaxivity of each of the particles.

13. The apparatus as recited in claim 12, wherein the set of instructions that cause the processor to determine the distribution of the ratio of the first relaxation time to the second relaxation time further cause the processor to determine a ratio of a first fluid surface relaxivity to a second fluid surface relaxivity when the pore size is below approximately 1 μm.

14. The apparatus as recited in claim 13, wherein the first fluid surface relaxivity is a longitudinal surface relaxivity and the second surface relaxivity is a transverse surface relaxivity.

15. The apparatus as recited in claim 10, wherein the NMR measurements are performed by an NMR formation evaluation instrument comprising at least one of a borehole logging tool, a core analyzer, or a cutting analyzer.

16. The apparatus as recited in claim 10, wherein the one or more datasets are obtained from one or more laboratory.

17. An information processing system for estimating a property of an earth formation, the information processing system comprising a processor and a memory device coupled to the processor, the memory device containing a set of instructions that, when executed by the processor, cause the processor to:
 receive at least one porosity dataset;
 analyze the at least one porosity dataset to determine at least pore-throat size distribution;
 receive at least one NMR measurements dataset from a nuclear magnetic resonance (NMR) tool;
 analyze the at least one NMR measurements dataset to determine a distribution of a first relaxation time versus a second relaxation time;
 determine distribution of a ratio of the first relaxation time to the second relaxation time by calculating a ratio between a geometric mean of the first relaxation and the corresponding second relaxation time;
 determine a threshold for the ratio of the first relaxation time to the second relaxation time, wherein the threshold indicates a value of the ratio corresponding to pore sizes not contributing to a permeability of the formation;
 predict the permeability of the formation using ratios that are below the determined threshold for the ratio of the first relaxation time to the second relaxation time; and
 select a method of producing hydrocarbons based on the predicted permeability of the formation;
 wherein hydrocarbons are produced based on the predicted permeability of the formation using the selected method.

18. The information processing system as recited in claim 17, wherein the first relaxation time is a longitudinal relaxation time and the second relaxation time is a transverse relaxation time.

19. The information processing system as recited in claim 17, wherein the at least one porosity dataset includes information describing fluid particles in the pores, wherein a threshold pressure measurement is a pore throat size measurement and wherein the information comprises at least a fluid surface relaxivity of each of the particles.

* * * * *